United States Patent
Inoue et al.

(10) Patent No.: US 9,640,618 B2
(45) Date of Patent: May 2, 2017

(54) SILICON CARBIDE SEMICONDUCTOR DEVICE, METHOD OF MANUFACTURING SILICON CARBIDE SEMICONDUCTOR DEVICE AND METHOD OF DESIGNING SILICON CARBIDE SEMICONDUCTOR DEVICE

(71) Applicant: SHINDENGEN ELECTRIC MANUFACTURING CO., LTD., Tokyo (JP)

(72) Inventors: Tetsuto Inoue, Hanno (JP); Akihiko Sugai, Hanno (JP); Shunichi Nakamura, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 14/787,982

(22) PCT Filed: Sep. 24, 2014

(86) PCT No.: PCT/JP2014/075193
§ 371 (c)(1),
(2) Date: Oct. 29, 2015

(87) PCT Pub. No.: WO2016/046901
PCT Pub. Date: Mar. 31, 2016

(65) Prior Publication Data
US 2016/0254356 A1    Sep. 1, 2016

(51) Int. Cl.
*H01L 29/16* (2006.01)
*H01L 29/78* (2006.01)
(Continued)

(52) U.S. Cl.
CPC ...... *H01L 29/1608* (2013.01); *G06F 17/5068* (2013.01); *H01L 23/535* (2013.01);
(Continued)

(58) Field of Classification Search
None
See application file for complete search history.

(56) References Cited

U.S. PATENT DOCUMENTS

| | | |
|---|---|---|
| 2009/0283776 A1 | 11/2009 | Iwamuro |
| 2013/0228866 A1* | 9/2013 | Lee ................ H01L 21/82343 257/355 |
| 2016/0172372 A1 | 6/2016 | Yun et al. |
| 2016/0293753 A1 | 10/2016 | Inoue et al. |

FOREIGN PATENT DOCUMENTS

| | | |
|---|---|---|
| JP | H06132539 A | 5/1994 |
| JP | 2009278067 A | 11/2009 |

(Continued)

OTHER PUBLICATIONS

ISR for PCT/JP2014/075193 mailed on Dec. 22, 2014 and its English translation by Google Translate.
(Continued)

*Primary Examiner* — Johannes P Mondt
(74) *Attorney, Agent, or Firm* — Ladas & Parry, LLP (57) ABSTRACT

A silicon carbide semiconductor device includes a silicon carbide layer 32 of a first conductivity type, a silicon carbide layer 36 of a second conductivity type, a gate trench 20, a gate electrode 79 provided in the gate trench 20, and a protection trench 10 formed to a greater depth than the gate trench 20. A region in the horizontal direction that includes both the gate trench 20 and a protection trench 10 that surrounds only a part of the gate trench 20 in the horizontal direction is a cell region, and a region in the horizontal direction that includes a protection trench 10 and in which a gate pad 89 or a lead electrode connected to the gate pad 89 is disposed is a gate region.

7 Claims, 7 Drawing Sheets

(51) Int. Cl.
- *H01L 29/12* (2006.01)
- *G06F 17/50* (2006.01)
- *H01L 23/535* (2006.01)
- *H01L 29/06* (2006.01)
- *H01L 29/423* (2006.01)
- *H01L 29/66* (2006.01)
- *H01L 21/02* (2006.01)
- *H01L 21/768* (2006.01)

(52) U.S. Cl.
CPC ...... *H01L 29/0619* (2013.01); *H01L 29/0642* (2013.01); *H01L 29/0661* (2013.01); *H01L 29/0696* (2013.01); *H01L 29/4236* (2013.01); *H01L 29/66068* (2013.01); *H01L 29/66666* (2013.01); *H01L 29/66734* (2013.01); *H01L 29/7811* (2013.01); *H01L 29/7813* (2013.01); *H01L 29/7827* (2013.01); *H01L 21/02529* (2013.01); *H01L 21/76895* (2013.01)

(56) References Cited

FOREIGN PATENT DOCUMENTS

| JP | 2012164851 A | 8/2012 |
| JP | 2012238769 A | 12/2012 |
| JP | 2012243985 A | 12/2012 |

OTHER PUBLICATIONS

Office Action dated Feb. 9, 2017 for U.S. Appl. No. 14/774,129 (now published as U.S. 2016/0293753).

International Search Report for PCT/JP2014/075192 mailed on Dec. 22, 2014 its English translation from WIPO.

Written Opinion of the International Searching Authority for PCT/JP2014/075192 mailed on Dec. 22, 2014 0168275 and its English translation by Google Translate.

Written Opinion of the International Searching Authority for PCT/JP2014/075193 mailed on Dec. 22, 2014 and its English translation by Google Translate.

* cited by examiner

SILICON CARBIDE SEMICONDUCTOR DEVICE, METHOD OF MANUFACTURING SILICON CARBIDE SEMICONDUCTOR DEVICE AND METHOD OF DESIGNING SILICON CARBIDE SEMICONDUCTOR DEVICE

CROSS-REFERENCE TO RELATED APPLICATIONS

This application is the U.S. National Stage of International Patent Application No. PCT/JP2014/075193 filed on Sep. 24, 2014, the disclosure of which is hereby incorporated in its entirety by reference.

TECHNICAL FIELD

The present invention relates to a silicon carbide semiconductor device, which is made of silicon carbide, a method of manufacturing the silicon carbide semiconductor device, and a method of designing the silicon carbide semiconductor device.

BACKGROUND ART

There are known conventional semiconductor devices made of silicon, such as a trench-type Si-MOSFET. Japanese Patent Laid-Open No. 06-132539 discloses a semiconductor device having a vertical insulated gate field effect transistor that includes a semiconductor substrate of a first conductivity type, a first semiconductor layer of the first conductivity type of low impurity concentration formed on the principal surface of the semiconductor substrate, a second semiconductor layer of a second conductivity type formed on the upper surface of the first semiconductor layer, a third semiconductor layer of the first conductivity type formed on a part of a surface part of the second semiconductor layer, a gate oxide film formed on an inner wall surface of a gate trench, which has a substantially U-shaped cross section and extends from the surface of a central part of the third semiconductor layer through the part of the second semiconductor layer into the first semiconductor layer, a gate electrode formed to fill a groove on the gate oxide film, an insulating film formed to cover the gate electrode and an exposed surface of the second semiconductor layer, a gate wire that is formed on the insulating film and is in contact with the gate electrode, a source electrode that is in contact with the third semiconductor layer through a contact hole formed in the insulating film, and a drain electrode formed on the back surface of the semiconductor substrate. Japanese Patent Laid-Open No. 06-132539 discloses a structure in which the gate trench is formed in a ring-like shape.

A silicon carbide semiconductor device made of silicon carbide, such as a SiC-MOSFET, has a high breakdown voltage, so that the gate trench can be insufficient to prevent an electrical field from excessively concentrated in the gate oxide film, and the gate oxide film can break.

To avoid this, the electrical field can be prevented from being applied to a gate trench 20 by a protection trench 10 that surrounds the whole of the periphery of the gate trench 20 in the horizontal direction. However, if such a protection trench 10 is adopted, a wire of a conductive material 81, such as polysilicon, that is connected to a gate pad from above the gate trench 20 has to be placed so as to pass across the protection trench 10 (see FIG. 7). Therefore, a predetermined part of the protection trench 10 (the part indicated by an arrow in the implementation shown in FIG. 7) has to be filled with an insulating material, such as an oxide, and the wire of the conductive material has to be passed over the insulating material. Thus, the number of manufacturing steps disadvantageously increases.

SUMMARY OF THE INVENTION

Problems to be Resolved by the Invention

In view of the circumstances described above, the present invention provides a silicon carbide semiconductor device provided with a protection trench that surrounds a gate trench to prevent an electrical field from being applied to the gate trench and can be formed without significantly increasing the number of manufacturing steps, a method of manufacturing the silicon carbide semiconductor device, and a method of designing the silicon carbide semiconductor device.

Means of Solving the Problem

A silicon carbide semiconductor device according to the present invention, the silicon carbide semiconductor device comprising:

a silicon carbide layer of a first conductivity type;

a silicon carbide layer of a second conductivity type formed on the silicon carbide layer of the first conductivity type;

a gate trench formed to extend from a surface of the silicon carbide layer of the second conductivity type to such a depth that the gate trench reaches the silicon carbide layer of the first conductivity type;

a gate electrode provided in the gate trench with an insulating film interposed therebetween;

a protection trench formed to extend from the surface of the silicon carbide layer of the second conductivity type to a depth greater than the depth of the gate trench; and a first conductive member provided in the protection trench, wherein a region in a horizontal direction that includes both the gate trench and a protection trench that surrounds only a part of the gate trench in the horizontal direction is a cell region, a region in the horizontal direction that includes a protection trench and in which a gate pad or a lead electrode connected to the gate pad is disposed is a gate region, a second conductive member is provided above the gate trench in the cell region and in the gate region, and the second conductive member is disposed to extend from above the gate trench in the cell region to the gate region through above a part of the cell region in which the protection trench is not provided.

In the silicon carbide semiconductor device, the protection trench included in the cell region has a pair of cell-region linear trench sections that extend straight in the horizontal direction and a cell-region curved trench section that is curved in the horizontal direction, the cell-region curved trench section is provided at a first end of the pair of cell-region linear trench sections, the gate trench is provided between the pair of cell-region linear trench sections in the horizontal direction, and the second conductive member is disposed to extend from above the gate trench in the cell region to the gate region through above a second end of the pair of cell-region linear trench sections.

In the silicon carbide semiconductor device, the gate trench extends straight in the horizontal direction, and the gate trench and the cell-region liner trench sections extend in parallel with each other in the horizontal direction.

In the silicon carbide semiconductor device, the protection trench included in the gate region has a gate-region curved trench section that is curved in the horizontal direction, and a gate-region curved trench section that protrudes toward the gate trench in the horizontal direction is provided at the second end of the pair of cell-region linear trench sections.

In the silicon carbide semiconductor device, a gate-region curved trench section that protrudes toward the gate-region curved trench section that protrudes toward the gate trench is provided adjacent to the gate-region curved trench section that protrudes toward the gate trench.

In the silicon carbide semiconductor device, the protection trenches are unicursal in the horizontal direction.

A method of manufacturing silicon carbide semiconductor device according to the present invention, the method comprising:

a step of forming a silicon carbide layer of a first conductivity type;

a step of forming a silicon carbide layer of a second conductivity type on the silicon carbide layer of the first conductivity type;

a step of forming a gate trench that extends from a surface of the silicon carbide layer of the second conductivity type to such a depth that the gate trench reaches the silicon carbide layer of the first conductivity type;

a step of forming a protection trench that extends from the surface of the silicon carbide layer of the second conductivity type to a depth greater than the depth of the gate trench;

a step of providing a gate electrode in the gate trench with an insulating film interposed therebetween; and a step of providing a first conductive member in the protection trench, wherein a region in a horizontal direction that includes both the gate trench and a protection trench that surrounds only a part of the gate trench in the horizontal direction is a cell region, a region in the horizontal direction that includes a protection trench and in which a gate pad or a lead electrode connected to the gate pad is disposed is a gate region, a second conductive member is provided above a part of the gate trench in the cell region and in the gate region, and the second conductive member is disposed to extend from above the gate trench in the cell region to the gate region through above a part of the cell region in which the protection trench is not provided.

A method of designing a silicon carbide semiconductor device according to the present invention, wherein the silicon carbide semiconductor device comprises:

a silicon carbide layer of a first conductivity type;

a silicon carbide layer of a second conductivity type formed on the silicon carbide layer of the first conductivity type;

a gate trench formed to extend from a surface of the silicon carbide layer of the second conductivity type to such a depth that the gate trench reaches the silicon carbide layer of the first conductivity type;

a gate electrode provided in the gate trench with an insulating film interposed therebetween;

a protection trench formed to extend from the surface of the silicon carbide layer of the second conductivity type to a depth greater than the depth of the gate trench; and a first conductive member provided in the protection trench, a region in a horizontal direction that includes both the gate trench and a protection trench that surrounds only a part of the gate trench in the horizontal direction is a cell region, a region in the horizontal direction that includes a protection trench and in which a gate pad or a lead electrode connected to the gate pad is disposed is a gate region, a second conductive member is provided above the gate trench in the cell region and in the gate region, and the second conductive member is disposed to extend from above the gate trench in the cell region to the gate region through above a part of the cell region in which the protection trench is not provided.

Advantageous Effects of Invention

According to the present invention, the second conductive member is disposed to extend from above the gate trench in the cell region to the gate region through a part of the cell region that is not surrounded by the protection trench. Therefore, there is no need to fill the protection trench with an insulating material, such as an oxide, so that the gate trench can be surrounded by the protection trench to prevent an electrical field from being applied to the gate trench without significantly increasing the number of manufacturing steps.

DESCRIPTION OF EMBODIMENTS

Embodiment

<<Configuration>>

In the following, a silicon carbide semiconductor device, a method of manufacturing the silicon carbide semiconductor device and a method of designing the silicon carbide semiconductor device according to an embodiment of the present invention will be described with reference to the drawings.

The silicon carbide semiconductor device according to this embodiment is a trench-structure MOSFET, for example. In the following, the silicon carbide semiconductor device will be described as the trench-structure MOSFET. However, the trench-structure MOSFET is only an example of the silicon carbide semiconductor device, and the present invention can be applied to other device structures having a MOS gate, such as an insulated gate bipolar transistor (IGBT).

Figure 1:
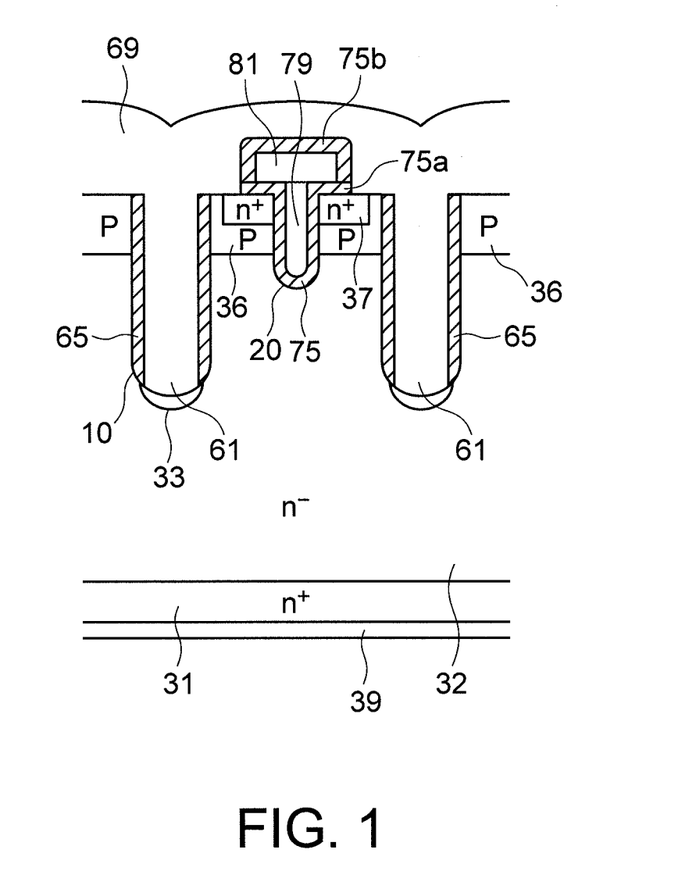
FIG. 1 is a cross-sectional view of a silicon carbide semiconductor device according to an embodiment of the present invention, which shows a cross section of a part of the arrangement shown in FIG. 3 taken in an up-and-down direction.

As shown in FIG. 1, the silicon carbide semiconductor device according to this embodiment includes an n-type silicon carbide semiconductor substrate 31 of high concentration (a silicon carbide semiconductor substrate of a first conductivity type), an n-type silicon carbide layer 32 of low concentration (a silicon carbide layer of the first conductivity type) formed on the n-type silicon carbide semiconductor substrate 31 of high concentration, and a p-type silicon carbide layer 36 (a silicon carbide layer of a second conductivity type) formed on the n-type silicon carbide layer 32 of low concentration. An n-type silicon carbide region 37 containing a high concentration of impurities is formed in a part of a surface of the p-type silicon carbide layer 36.

According to this embodiment, a gate trench 20 is formed to extend from a surface of the n-type silicon carbide region 37 containing a high concentration of impurities to such a depth that the gate trench 20 penetrates the p-type silicon carbide layer 36 into the n-type silicon carbide layer 32 of low concentration. In the gate trench 20, a gate electrode 79 is provided with a gate insulating film 75a interposed therebetween. An interlayer insulating film 75b is provided on the gate electrode 79. That is, the gate electrode 79 is surrounded by the gate insulating film 75a and the interlayer insulating film 75b.

A protection trench 10 is formed to extend from the surface of the p-type silicon carbide layer 36 to a greater depth than the gate trench 20. In the protection trench 10, a first conductive member 61 made of polysilicon, for example, is provided. According to this embodiment, the first conductive member 61 is integrated with a source electrode 69 and is set at the same potential as the source electrode 69 when a voltage is applied (see FIG. 1). A side wall insulating film 65 is provided on a side wall of the protection trench 10.

According to this embodiment, a p-type semiconductor region 33 of high concentration is formed on a bottom of the protection trench 10 by ion implantation of aluminium or the like. A drain electrode 39 is provided on a back surface (lower surface in FIG. 1) of the n-type silicon carbide semiconductor substrate 31.

Figure 4:
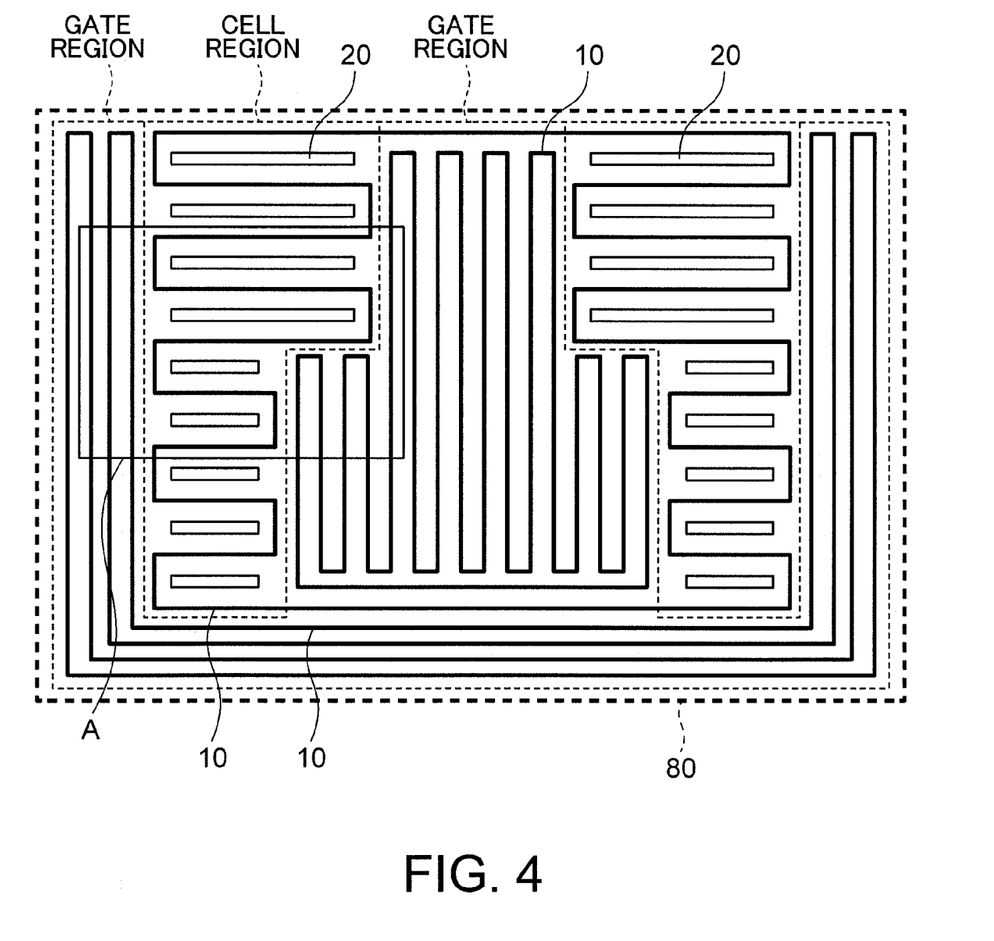
FIG. 4 is a schematic top view for illustrating a cell region and a gate region of the silicon carbide semiconductor device according to the embodiment of the present invention.

As shown in FIG. 4, according to this embodiment, a region in a horizontal direction that includes both a gate trench 20 and a protection trench 10 that surrounds the gate trench 20 with only a part of the gate trench 20 left unenclosed by the protection trench 10 is referred to as a "cell region". FIG. 4 is just a schematic top view for illustrating the cell region and a gate region of the silicon carbide semiconductor device according to this embodiment. FIG. 4 does not show any detailed structure of the protection trench 10 and does not take into account the distances between sections of the protection trench 10 in the horizontal direction. The sizes of the cell region and the gate region in the horizontal direction shown in FIG. 4 are not to scale.

As shown in FIG. 4, according to this embodiment, a region in the horizontal direction that includes a protection trench 10 and a gate pad 89 (see FIG. 2) or a lead electrode connected to the gate pad 89 is referred to as the "gate region". A second conductive member 81 is made of polysilicon, for example.

Figure 5:
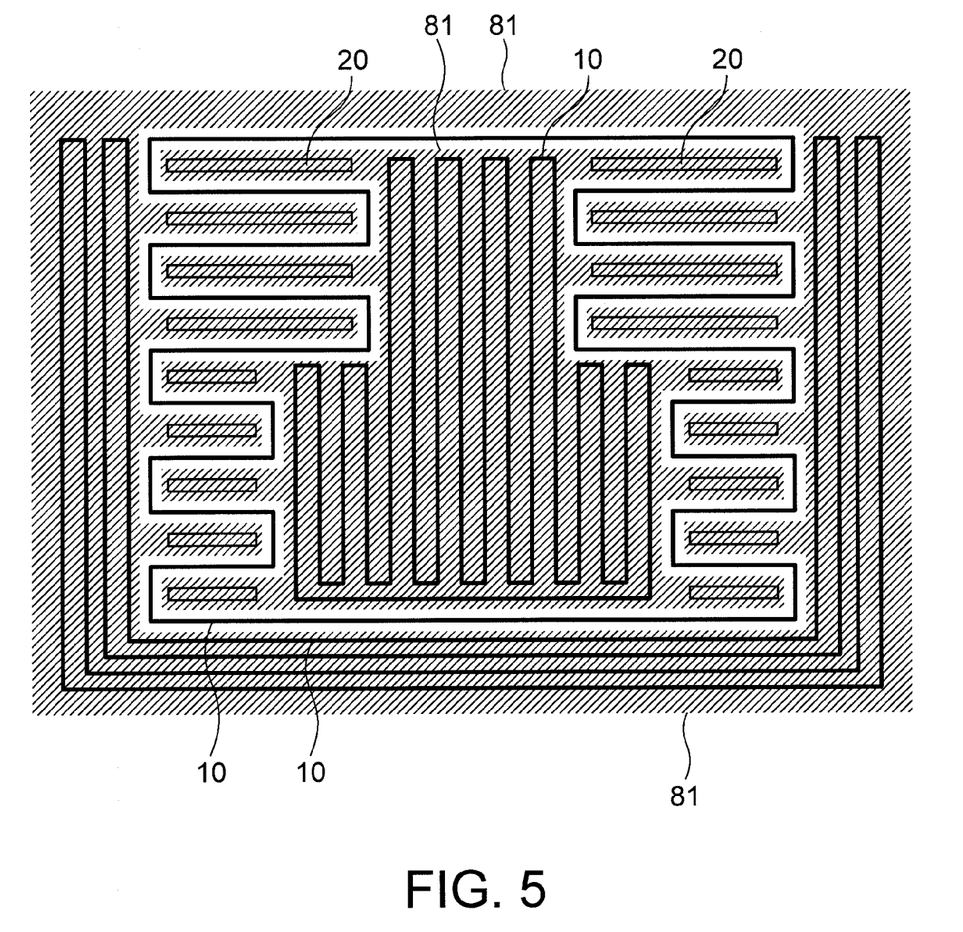
FIG. 5 is a schematic top view for illustrating an arrangement of a second conductive member of the silicon carbide semiconductor device according to the embodiment of the present invention.

The gate pad 89 is disposed in the gate region shown in the central part of FIG. 4 (see FIG. 2), and the lead electrode is connected to the gate pad 89. As shown in FIG. 5, the second conductive member 81 is primarily disposed in an area other than above the protection trench 10 disposed in the cell region.

Figure 3:
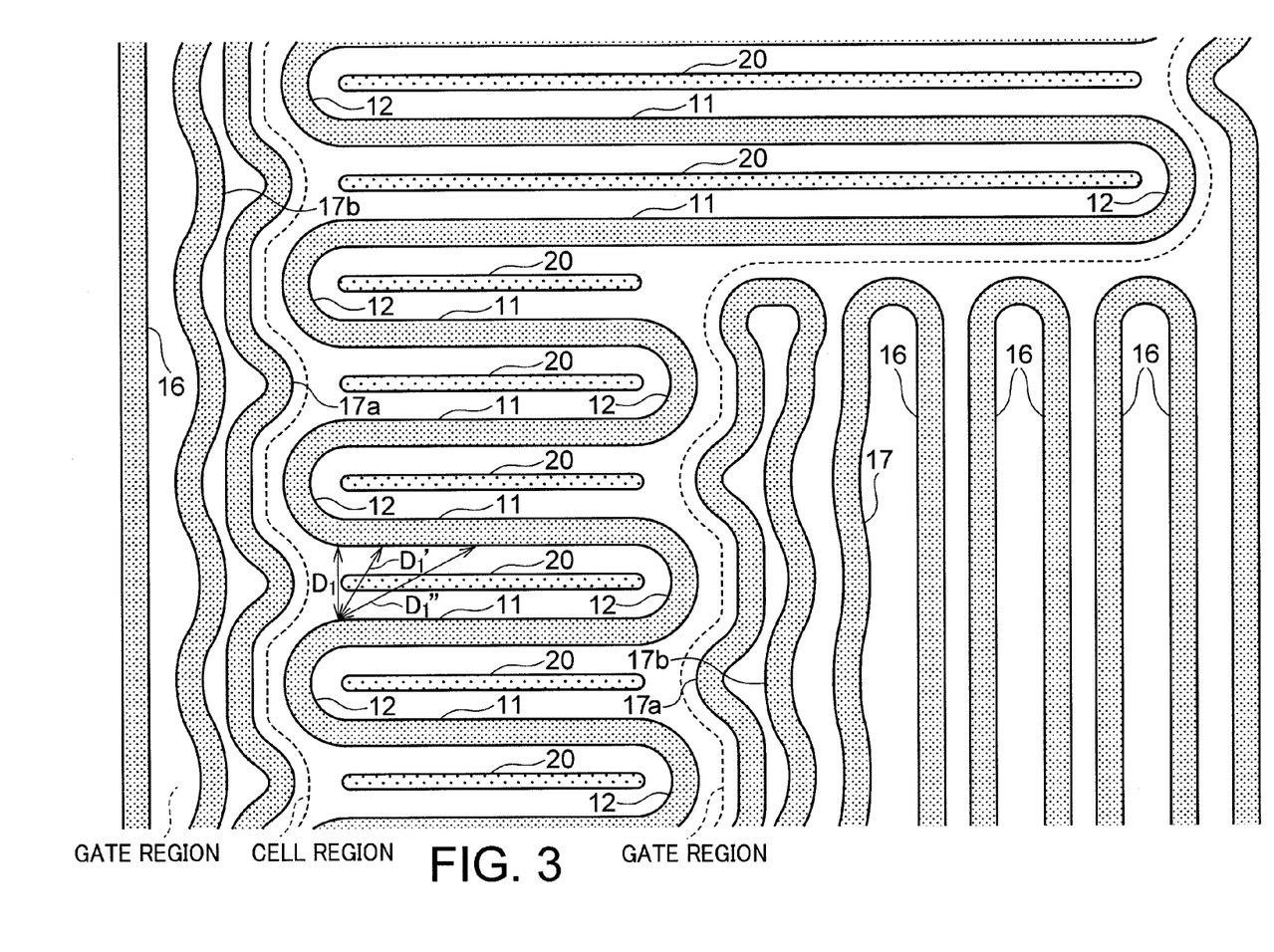
FIG. 3 is an enlarged top view of a part of the silicon carbide semiconductor device according to the embodiment of the present invention, which shows the part "A" in FIG. 4.

As shown in FIG. 3, the protection trench 10 included in the gate region according to this embodiment has a gate-region linear trench section 16 that extends straight in the horizontal direction and a gate-region curved trench section 17 that is curved in the horizontal direction. Reference numeral "17" conceptually includes reference numerals "17a" and "17b" described later. The p-type semiconductor region 33 and the first conductive member 61 are in ohmic contact with each other and are set to the same potential when a voltage is applied.

The gate trench 20 according to this embodiment extends straight in the horizontal direction. More specifically, the gate trench 20 extends straight in the left-and-right direction in FIG. 3. The gate trench 20 and a cell-region linear trench section 11 extend in parallel with each other (in the left-and-right direction in FIG. 3) in the horizontal direction.

As shown in FIG. 3, the protection trench 10 included in the cell region has a pair of cell-region linear trench sections 11 that extend straight in the horizontal direction and a cell-region curved trench section 12 that is curved in the horizontal direction. The gate trench 20 extending straight in the horizontal direction (that is, extending in the left-and-right direction in FIG. 3) is located between the pair of cell-region linear trench sections 11, the cell-region curved trench section 12 is located at one end of the pair of cell-region linear trench sections 11, and the protection trench 10 is not formed at the other end of the pair of cell-region linear trench sections 11. Thus, the protection trench 10 surrounds "only a part" of the gate trench 20 in the horizontal direction. According to this embodiment, the protection trench 10 in the cell region forms successive "S-shapes" in the horizontal direction, and pairs of cell-region linear trench sections 11 are arranged in the up-and-down direction in FIG. 3 in such a manner that the "other ends" thereof are located alternately on the left and right sides. In this way, both the condition that the protection trench 10 surrounds "only a part" of the gate trench 20 in the horizontal direction and a condition that the protection trench 10 has no end in the horizontal direction can be satisfied at the same time.

Figure 2:
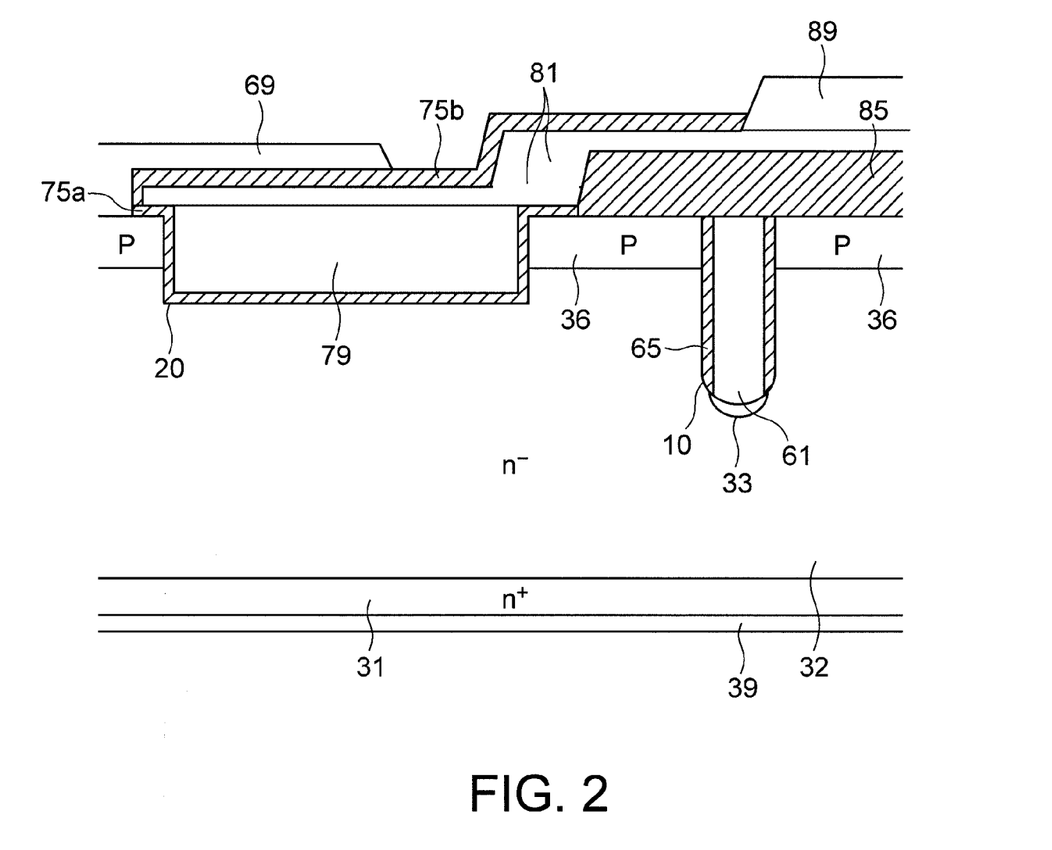
FIG. 2 is a cross-sectional view of the silicon carbide semiconductor device according to the embodiment of the present invention, which shows a cross section of the arrangement shown in FIG. 3 taken in a left-and-right direction.

As shown in FIG. 2, the second conductive member 81 is provided above a part of the gate trench 20 in the cell region and in the gate region. The second conductive member 81 is disposed in an area of the cell region where the protection trench 10 is not provided, that is, according to this embodiment, over an area that extends from above the gate trench 20 in the cell region into the gate region through the other end of the pair of cell-region linear trench sections 11 (see FIG. 5). Thus, the second conductive member 81 is provided to extend from above the gate electrode 79 into below the gate pad 89 through above the other end of the pair of cell-region linear trench sections 11. As shown in FIG. 2, the gate pad 89 is provided on the protection trench 10 in the gate region with an insulating layer 85 of $SiO_2$ or the like and the second conductive member 81 interposed therebetween. As is obvious from FIG. 2, the second conductive member 81 is electrically connected to the gate electrode 79.

As shown in FIG. 3, a gate-region curved trench section 17a that protrudes toward the gate trench 20 in the horizontal direction is provided at the other end of the pair of cell-region linear trench sections 11. A gate-region curved trench section 17b that protrudes toward the gate-region curved trench section 17a that protrudes toward the gate trench 20 is provided adjacent to the gate-region curved trench section 17a.

As shown in FIG. 4, according to this embodiment, a guard ring 80 that surrounds the gate region and the cell region in the horizontal direction is provided. Although FIG. 4 shows only one guard ring 80, in actual, a plurality of guard rings 80 may be concentrically provided.

As shown in FIG. 4, each protection trench 10 according to this embodiment is unicursal in plan view and has no end in the horizontal direction.

<<Manufacturing Process>>

Next, a process of manufacturing the silicon carbide semiconductor device according to this embodiment configured as described above will be described mainly with reference to FIG. 6. According to this embodiment, the process of manufacturing the silicon carbide semiconductor device includes a method of designing the silicon carbide semiconductor device manufactured as described below.

Figure 6:
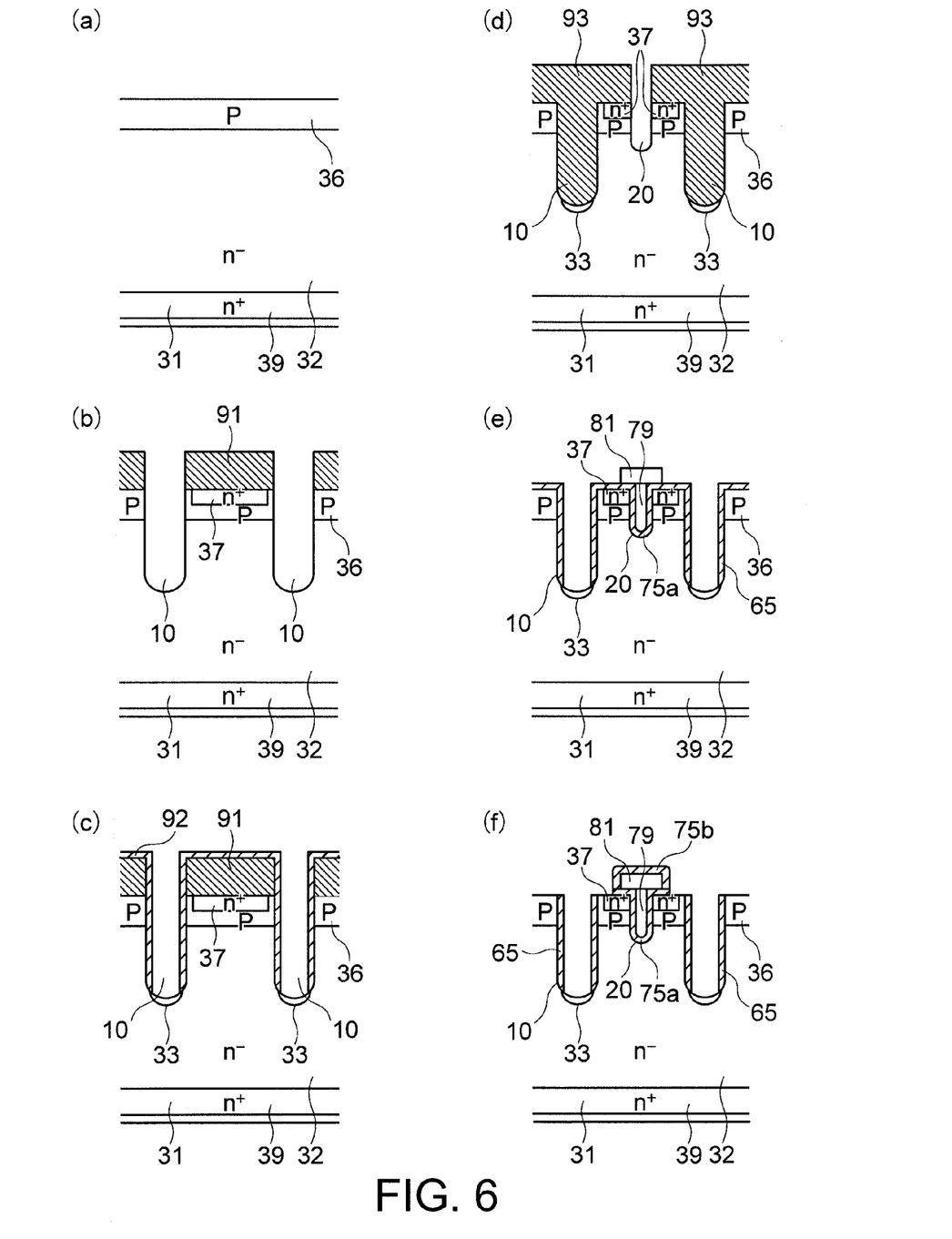
FIG. 6 are cross-sectional views for illustrating a method of manufacturing the silicon carbide semiconductor device according to the embodiment of the present invention, which correspond to the cross-sectional view of FIG. 1.

First, the n-type silicon carbide semiconductor substrate 31 of high concentration is prepared (see FIG. 6(a)).

The n-type silicon carbide layer 32 of low concentration is then formed by epitaxial growth on the n-type silicon carbide semiconductor substrate 31 of high concentration.

The p-type silicon carbide layer 36 is then formed on the n-type silicon carbide layer 32 of low concentration by epitaxial growth or ion implantation.

The n-type silicon carbide region 37 containing a high concentration of impurities is then formed by phosphorus ion implantation or the like in a part of the p-type silicon carbide layer 36 where the gate trench 20 is to be formed and a vicinity area thereof. A protection layer 91 is then deposited, and the protection layer 91 is patterned to form an opening through which the protection trench 10 is formed (see FIG. 6(b)). Using the protection layer 91 as a mask, the protection trench 10 is then formed to extend from the surface of the p-type silicon carbide layer 36 to such a depth that the protection trench 10 reaches the n-type silicon carbide layer 32 of low concentration.

A protection film 92 is then formed to cover the protection layer 91 and the protection trench 10 (see FIG. 6(c)).

Only a part of the protection film 92, which is on the bottom of the protection trench 10, is then removed. Using the remaining protection film 92 as a mask, ion implantation of aluminium or the like is performed on the bottom of the protection trench 10 to form the p-type semiconductor region 33 containing a high concentration of impurities. After that, the protection film 92 and the protection layer 91 are removed. After that, activation annealing is performed.

A protection layer 93 is then deposited, and the protection layer 93 is patterned to form an opening through which the gate trench 20 is formed (see FIG. 6(d)). Using the protection layer 93 as a mask, the gate trench 20 is then formed to extend from the surface of the p-type silicon carbide layer 36 to such a depth that the gate trench 20 reaches the n-type silicon carbide layer 32 of low concentration. The depth of the gate trench 20 is smaller than the depth of the protection trench 10. After that, the protection layer 93 is removed.

A heat treatment is then performed on the surface of the silicon carbide semiconductor device including the gate trench 20 and the protection trench 10 to form an oxide film that is to form the gate insulating film 75a and the side wall insulating film 65. A conductive material, such as polysilicon, is then deposited on the gate insulating film 75a. After the deposition, a heat treatment may be performed as required. In this way, the gate electrode 79 and the second conductive member 81 are formed on the gate trench 20 as shown in FIG. 6(e).

An insulating film of silicon dioxide ($SiO_2$) or the like is then formed by plasma CVD or the like to cover the surface of the silicon carbide semiconductor device including the protection trench 10, thereby forming the interlayer insulating film 75b on the gate electrode 79 so that the gate electrode 79 is surrounded by the gate insulating film 75a and the interlayer insulating film 75b (see FIG. 6(f)). In addition, the insulating film on the bottom of the protection trench 10 is selectively removed by etching, leaving only the side wall insulating film 65 on the side wall of the protection trench 10.

After that, the first conductive member 61, the insulating layer 85, the second conductive member 81, the gate pad 89, the source electrode 69, the drain electrode 39, the lead electrode and the like are provided as required. In this way, the silicon carbide semiconductor device according to this embodiment is manufactured (see FIGS. 1 and 2).

The arrangement of the protection trench 10 of the silicon carbide semiconductor device manufactured as described above in the horizontal plane is as described above in the section <<Configuration>>. The manufacturing method described above is just an example, and any manufacturing method that can manufacture the silicon carbide semiconductor device described in the claims can be adopted.

<<Effects and Advantages>>

Next, effects and advantages of this embodiment will be described.

According to this embodiment, the second conductive member 81 is disposed to extend from above the gate trench 20 in the cell region into the gate region through the part of the cell region that is not enclosed by the protection trench 10. Therefore, there is no need to fill the protection trench 10 with an insulating material, such as an oxide, so that the gate trench 20 can be surrounded by the protection trench 10 to prevent an electrical field from being applied to the gate trench 20 without significantly increasing the number of manufacturing steps.

Figure 7:
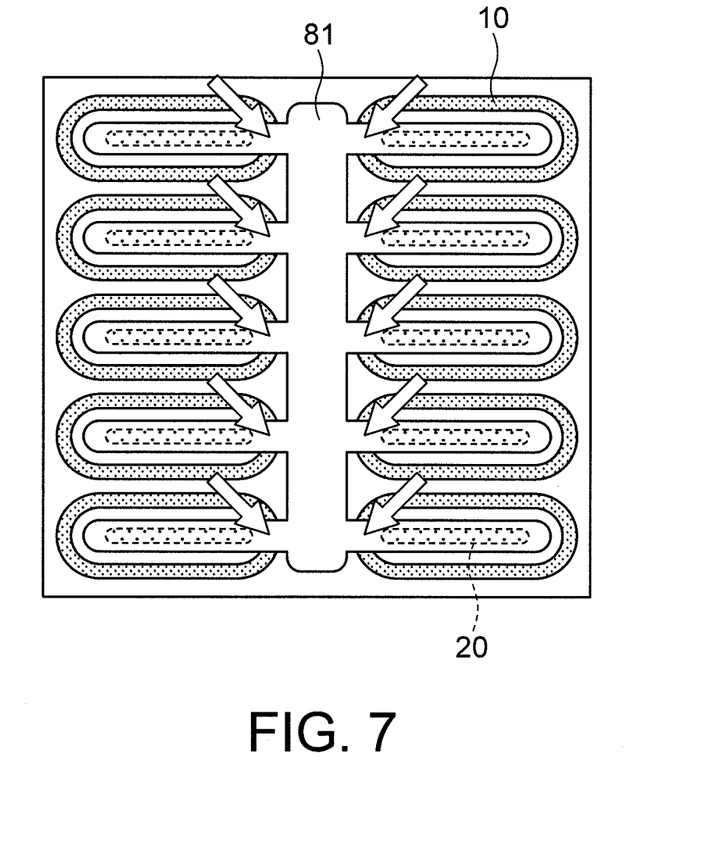
FIG. 7 is a schematic top view for illustrating an implementation in which the whole of the periphery of a gate trench in the horizontal direction is surrounded by a protection trench.

According to prior art, a wire of a conductive material, such as polysilicon, that is connected to the gate pad from above the gate trench 20 has to be placed so as to pass across the protection trench 10 (see FIG. 7). Therefore, a predetermined part of the protection trench 10 (the part indicated by an "arrow" in the implementation shown in FIG. 7) has to be filled with an insulating material, such as an oxide, and the wire of the conductive material has to be passed over the insulating material. Thus, the number of manufacturing steps disadvantageously increases.

According to this embodiment, however, the second conductive member 81 is disposed to extend from above the gate electrode 79 to below the gate pad 89 through above the part of the cell region that is not enclosed by the protection trench 10 or, more specifically, the part at the other end of the pair of cell-region linear trench sections 11 (see FIGS. 2 and 5). Therefore, according to this embodiment, there is no need to fill the protection trench 10 with an insulating material, such as an oxide, which would be necessary according to prior art, so that the manufacturing steps can be reduced compared with prior art.

Furthermore, according to this embodiment, the protection trench 10 in the cell region forms successive "S shapes" in the horizontal direction, and pairs of cell-region linear trench sections 11 are arranged in the up-and-down direction in FIG. 3 in such a manner that the "other ends" thereof are located alternately on the left and right sides. In this way, both the condition that the protection trench 10 surrounds "only a part" of the gate trench 20 in the horizontal direction and the condition that the protection trench 10 has no end in the horizontal direction can be satisfied at the same time.

If the protection trench 10 has a starting or terminating end part in the horizontal direction, the starting or terminating end can have an angled corner. And if such an angled corner is formed, an electrical field can be concentrated at the angled corner. According to this embodiment, however, the protection trench 10 is unicursal in the horizontal direction (in plan view) and has no starting or terminating end in the horizontal direction.

Therefore, according to this embodiment, the number of manufacturing steps can be advantageously reduced compared with prior art, and an electrical field can be advantageously prevented from excessively concentrated at any end of the protection trench 10.

Furthermore, according to this embodiment, the protection trench 10 included in the gate region has the gate-region curved trench section 17 that is curved in the horizontal direction. And the gate-region curved trench section 17a that protrudes toward the gate trench 20 in the horizontal direction is provided at the other end of the pair of cell-region linear trench sections 11. Therefore, the number of manufacturing steps can be advantageously reduced compared with prior art while preventing the horizontal distance between the protection trench 10 included in the cell region and the gate-region curved trench section 17 from increasing.

This will now be described.

In general, the longer the horizontal distance between sections of the protection trench 10, the higher the electrical field applied to the protection trench 10 is. However, if the cell-region curved trench section 12 is not formed at the other end of the pair of cell-region linear trench sections 11 as in this embodiment, there is no protection trench 10 that protrudes toward the gate region, so that the horizontal distance between the protection trench 10 included in the cell region and the protection trench 10 included in the gate region tends to increase.

In this respect, according to this embodiment, the protection trench 10 included in the gate region has the gate-region curved trench section 17a that protrudes toward the gate trench 20 in the horizontal direction. Therefore, the horizontal distance between the protection trench 10 included in the cell region and the gate-region curved trench section 17 can be reduced. As a result, the condition that the protection trench 10 surrounds "only a part" of the gate trench 20 in the horizontal direction can be satisfied, while reducing the electrical field that occurs between the protection trench 10 included in the cell region and the gate-region curved trench section 17 during reverse biasing and preventing the electrical field from being locally excessively concentrated in this area.

Furthermore, according to this embodiment, the gate-region curved trench section 17b that protrudes toward the gate-region curved trench section 17a that protrudes toward the gate trench 20 is provided adjacent to the gate-region curved trench section 17a. Therefore, the horizontal distance between the gate-region curved trench section 17a that protrudes toward the gate trench 20 and the gate-region curved trench section 17b that is adjacent to the gate-region curved trench section 17a can be reduced. As a result, during reverse biasing, the electrical field that occurs between the gate-region curved trench sections 17 can be reduced, and the electrical field can be prevented from being locally excessively concentrated in this area.

The "horizontal distance" referred to in this embodiment means the "minimum distance" in the horizontal direction. Taking a cell-region linear trench section 11 as an example, it can be considered that there are an infinite number of distances from a point in the cell-region linear trench section 11 to an opposed cell-region linear trench section 11, such as "D1" as well as "D1'" and "D1''" shown in FIG. 3. According to this embodiment, however, since the "horizontal distance" is defined as the "minimum distance" in the horizontal direction as described above, the "horizontal distance" is not "D1'" or "D1''" but the minimum distance "D1".

(Modifications)

According to this embodiment, an implementation can be adopted in which the smaller the radius of curvature of the cell-region curved trench section 12, the smaller the horizontal distance between the cell-region curved trench section 12 and the protection trench 10 in the gate region adjacent to the cell-region curved trench section 12 is.

If the implementation is adopted in which the smaller the radius of curvature of the cell-region curved trench section 12 is, the smaller the horizontal distance between the cell-region curved trench section 12 and the protection trench 10 in the gate region adjacent to the cell-region curved trench section 12 is, the electrical field can be prevented from being locally excessively concentrated in the part of the cell-region curved trench section 12 of the small radius of curvature during reverse biasing.

Similarly, an implementation can be adopted in which the smaller the radius of curvature of the gate-region curved trench section 17 is, the smaller the horizontal distance between the gate-region curved trench section 17 and the protection trench 10 in the gate region adjacent to the gate-region curved trench section 17 is.

If the implementation is adopted in which the smaller the radius of curvature of the gate-region curved trench section 17, the smaller the horizontal distance between the gate-region curved trench section 17 and the protection trench 10 in the gate region adjacent to the gate-region curved trench section 17 is, the electrical field can be prevented from being locally excessively concentrated in the part of the gate-region curved trench section 17 of the small radius of curvature during reverse biasing.

Finally, the above description of the embodiment, the above description of the modifications and the drawings are given only as examples for the purpose of illustration of the present invention set forth in the claims and do not limit the present invention set forth in the claims.

REFERENCE SIGNS LIST 10 protection trench
11 cell-region linear trench section
12 cell-region curved trench section
16 gate-region linear trench section
17 gate-region curved trench section
17a gate-region curved trench section
17b gate-region curved trench section
20 gate trench 31 n-type silicon carbide semiconductor substrate (silicon carbide semiconductor substrate of first conductivity type)
32 n-type silicon carbide layer (silicon carbide layer of first conductivity type)
36 p-type silicon carbide layer (silicon carbide layer of second conductivity type)
61 first conductive member
69 source electrode
79 gate electrode
80 guard ring
81 second conductive member

The invention claimed is:

1. A silicon carbide semiconductor device, comprising:
a silicon carbide layer of a first conductivity type;
a silicon carbide layer of a second conductivity type formed on the silicon carbide layer of the first conductivity type;
a gate trench formed to extend from a surface of the silicon carbide layer of the second conductivity type to such a depth that the gate trench reaches the silicon carbide layer of the first conductivity type;
a gate electrode provided in the gate trench with an insulating film interposed between a wall of the gate trench and the gate electrode;
first and second protection trenches formed to extend from the surface of the silicon carbide layer of the second conductivity type to a depth greater than the depth of the gate trench; and
a first conductive member provided in the first and second protection trenches,
wherein a cell region in a horizontal extent includes both the gate trench and the first protection trench that surrounds a part of the gate trench in the horizontal extent, and
a gate region in the horizontal extent includes the second protection trench and in which a gate pad or a lead electrode connected to the gate pad is disposed,
a second conductive member is provided above the gate trench in the cell region and in the gate region,
wherein the second conductive member is disposed to extend from above the gate trench in the cell region to the gate region through a region of the second conductive member directly above a part of the cell region in which the first protection trench is not provided but is not disposed directly above any part of the cell region in which the first protection trench is provided.

2. The silicon carbide semiconductor device according to claim 1,
wherein the first protection trench included in the cell region has a pair of cell-region linear trench sections that extend straight in the horizontal extent and a cell-region curved trench section that is curved in the horizontal extent,
wherein the cell-region curved trench section is provided at a first end of the pair of cell-region linear trench sections,
the gate trench of the cell region is provided between the pair of cell-region linear trench sections in the horizontal extent, and
the second conductive member is disposed such as to extend from above the gate trench in the cell region to the gate region through a region of the second conductive member directly above a second end of the pair of cell-region linear trench sections but is not disposed directly above the first end of the pair of cell-region linear trench sections.

3. The silicon carbide semiconductor device according to claim 2,
wherein the gate trench extends straight in the horizontal extent, and
the gate trench and the cell-region linear trench sections extend in parallel with each other in the horizontal extent.

4. The silicon carbide semiconductor device according to claim 2,
wherein the second protection trench included in the gate region has a first gate-region curved trench section that is curved in the horizontal extent, and
wherein the first gate-region curved trench section protrudes toward the gate trench of the cell region in the horizontal extent and is provided at the second end of the pair of cell-region linear trench sections.

5. The silicon carbide semiconductor device according to claim 4,
wherein a second gate-region curved trench section that protrudes toward the gate trench is provided adjacent to the first gate-region curved trench section that protrudes toward the gate trench.

6. The silicon carbide semiconductor device according to claim 1, wherein the first and second protection trenches are unicursal in the horizontal extent.

7. A method of manufacturing silicon carbide semiconductor device, comprising:
forming a silicon carbide layer of a first conductivity type;
forming a silicon carbide layer of a second conductivity type on the silicon carbide layer of the first conductivity type;
forming a gate trench that extends from a surface of the silicon carbide layer of the second conductivity type to a depth such that the gate trench reaches the silicon carbide layer of the first conductivity type;
forming first and second protection trenches that extend from the surface of the silicon carbide layer of the second conductivity type to a depth greater than the depth of the gate trench;
providing a gate electrode in the gate trench with an insulating film interposed between a wall of the gate trench and the gate electrode; and
providing a first conductive member in the first and second protection trenches,
wherein a cell region in a horizontal extent includes both the gate trench and the first protection trench that surrounds a part of the gate trench in the horizontal extent, and
a gate region in the horizontal extent includes the second protection trench and in which a gate pad or a lead electrode connected to the gate pad is disposed,
a second conductive member is provided above a part of the gate trench in the cell region and in the gate region,
wherein the second conductive member is disposed to extend from above the gate trench in the cell region to the gate region through a region of the second conductive member directly above a part of the cell region in which the first protection trench is not provided but is not disposed directly above any part of the cell region in which the first protection trench is provided.

* * * * *